US012705169B2

(12) United States Patent
Kim et al.

(10) Patent No.: US 12,705,169 B2
(45) Date of Patent: Aug. 11, 2026

(54) MEMORY DEVICE FOR PERFORMING IN-MEMORY PROCESSING AND OPERATING METHOD THEREOF

(71) Applicant: SAMSUNG ELECTRONICS CO., LTD., Suwon-si (KR)

(72) Inventors: Byeongho Kim, Suwon-si (KR); Suk Han Lee, Suwon-si (KR); Kyomin Sohn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/904,765

(22) Filed: Oct. 2, 2024

(65) Prior Publication Data

US 2025/0321877 A1 Oct. 16, 2025

(30) Foreign Application Priority Data

Apr. 12, 2024 (KR) ........................ 10-2024-0049281

(51) Int. Cl.
*G06F 12/02* (2006.01)
*G11C 11/406* (2006.01)

(52) U.S. Cl.
CPC ........ *G06F 12/0223* (2013.01); *G11C 11/406* (2013.01)

(58) Field of Classification Search
CPC .... G06F 12/0223; G06F 12/02; G06F 3/0604; G06F 3/0658; G06F 15/7821; G06F 13/1668; G11C 11/34; G11C 11/40; G11C 11/4072; G11C 7/1039; G11C 7/1036; G11C 7/06; G11C 11/40618; G11C 11/406
See application file for complete search history.

(56) References Cited

U.S. PATENT DOCUMENTS 10,468,087 B2 11/2019 Lea et al.
11,094,371 B2 8/2021 O et al.
11,222,260 B2 * 1/2022 Lea ..................... G06N 3/0499
(Continued)

FOREIGN PATENT DOCUMENTS

KR 10-2020-0108768 A 9/2020

OTHER PUBLICATIONS

H. Kal, C. Yoo and W. W. Ro, "AESPA: Asynchronous Execution Scheme to Exploit Bank-Level Parallelism of Processing-in-Memory," 2023 56th IEEE/ACM International Symposium on Microarchitecture (MICRO), Toronto, ON, Canada, 2023, pp. 815-827.*

(Continued)

*Primary Examiner* — Pierre Michel Bataille
(74) *Attorney, Agent, or Firm* — Sughrue Mion, PLLC

(57) ABSTRACT

An in-memory processing memory device may include: a bank including a cell array; and a processing in memory (PIM) block, associated with the bank, including a register that stores a plurality of instructions. The PIM block is configured to: acquire one or more instructions of the plurality of instructions stored in the register; determine whether the one or more instructions operate independently of the bank; and based on the one or more instructions operating independently of the bank, perform computational processing corresponding to the one or more instructions during a first time interval in which the bank is in an inactive state.

19 Claims, 12 Drawing Sheets

(56) References Cited

U.S. PATENT DOCUMENTS

| | | | | |
|---|---|---|---|---|
| 11,282,563 | B2 | 3/2022 | Lea et al. | |
| 11,664,064 | B2 | 5/2023 | Lea et al. | |
| 12,106,107 | B2 * | 10/2024 | Lee | G11C 7/1006 |
| 12,417,024 | B2 * | 9/2025 | Adhinarayanan | G06F 3/0656 |
| 2013/0179664 | A1 * | 7/2013 | Olson | G06F 9/3895 712/215 |
| 2017/0263306 | A1 * | 9/2017 | Murphy | G11C 11/4091 |
| 2021/0216243 | A1 * | 7/2021 | Shin | G06N 3/065 |
| 2023/0046552 | A1 | 2/2023 | Mathew et al. | |
| 2023/0205693 | A1 | 6/2023 | Kotra et al. | |

OTHER PUBLICATIONS

G. F. Oliveira et al., “MIMDRAM: An End-to-End Processing-Using-DRAM System for High-Throughput, Energy-Efficient and Programmer-Transparent Multiple-Instruction Multiple-Data Computing,” 2024 IEEE International Symposium on High-Performance Computer Architecture (HPCA), Edinburgh, U. K., 2024, pp. 186-203.*

M. Item, G. F. Oliveira, J. Gómez-Luna, M. Sadrosadati, Y. Guo and O. Mutlu, “TransPimLib: Efficient Transcendental Functions for Processing-in-Memory Systems,” 2023 IEEE International Symposium on Performance Analysis of Systems and Software (ISPASS), Raleigh, NC, USA, 2023, pp. 235-247.*

P. R. Sutradhar, S. Bavikadi, S. M. P. Dinakarrao, M. A. Indovina and A. Ganguly, “3DL-PIM: A Look-Up Table Oriented Programmable Processing in Memory Architecture Based on the 3-D Stacked Memory for Data-Intensive Applications,” IEEE Transactions on Emerging Topics in Computing, vol. 12, pp. 60-72, Jan. 2024.*

* cited by examiner

Figure 2:
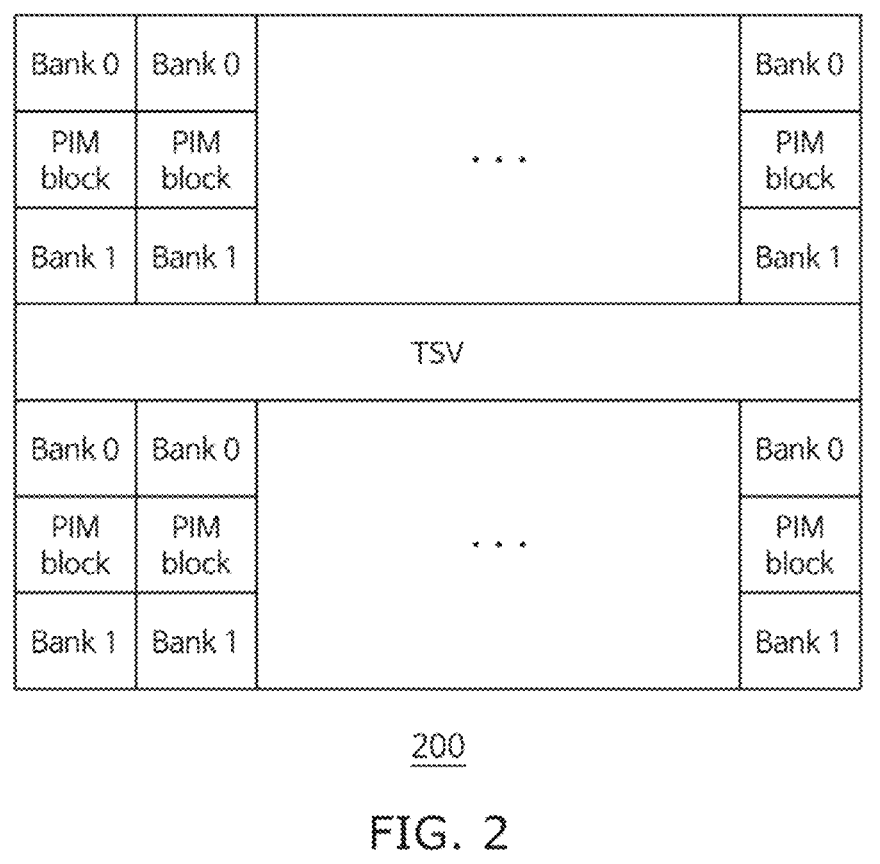

Bank 0
PIM block
Bank 1
Bank 0
PIM block
Bank 1
. . .
Bank 0
PIM block
Bank 1
TSV
Bank 0
PIM block
Bank 1
Bank 0
PIM block
Bank 1
. . .
Bank 0
PIM block
Bank 1

MEMORY DEVICE FOR PERFORMING IN-MEMORY PROCESSING AND OPERATING METHOD THEREOF

CROSS-REFERENCE TO RELATED APPLICATION

This application claims priority to Korean Patent Application No. 10-2024-0049281, filed in the Korean Intellectual Property Office on Apr. 12, 2024, the entire contents of which are hereby incorporated herein by reference.

BACKGROUND

1. Field

The present disclosure relates to a memory device for performing in-memory processing and a method for operating the same, and more specifically, to a memory device for performing computational processing corresponding to an instruction operating independently of a bank during a time interval in which the bank is in an inactive state, and a method for operating the same.

2. Description of Related Art

A computational processing device of a computing system may acquire data stored in a memory device and perform computations using the acquired data. Meanwhile, since the computational processing device performs the computations after acquiring the data from the memory device, the computational processing speed may be lowered. Therefore, in order to solve this problem, a method for installing a Processing In Memory (PIM) block in the memory device has been proposed.

The existing PIM block stops operation while the access of the PIM block to the bank in the memory device is limited. Accordingly, the computational processing of the PIM block is collectively stopped, which may lower the computational efficiency of the PIM block.

The information described above is intended to improve understanding of the background of the present disclosure, and may include information that does not constitute the related art.

SUMMARY

In order to solve one or more problems (e.g., the problems described above and/or other problems not explicitly described herein), the present disclosure relates to a memory device for solving the problems described above and a method for operating the same.

An object to be achieved by the present disclosure is not limited to the above, and other objects not mentioned may be clearly understood by those skilled in the art from the description of the present disclosure.

According to one or more example embodiments, an in-memory processing memory device may include: a bank including a cell array; and a processing in memory (PIM) block, associated with the bank, including a register that stores a plurality of instructions. The PIM block is configured to: acquire one or more instructions of the plurality of instructions stored in the register; determine whether the one or more instructions operate independently of the bank; and based on the one or more instructions operating independently of the bank, perform computational processing corresponding to the one or more instructions during a first time interval in which the bank is in an inactive state.

According to one or more example embodiments, a method for operating a memory device, performed by a processing in memory (PIM) block of a memory device and including: receiving, from a memory controller, a plurality of instructions to be executed in a PIM block; storing the plurality of instructions in a register of the PIM block; determining whether each of the plurality of instructions stored in the register operates independently of a bank associated with the PIM block; and performing, during a first time interval in which the bank is in an inactive state, computational processing corresponding to one or more instructions, of the plurality of instructions stored in the register, that operate independently of the bank.

According to one or more example embodiments, an in-memory processing memory device may include: a plurality of core dies that are stacked and interconnected via a plurality of channels provided by a plurality of through silicon vias (TSV); and a buffer die configured to control the plurality of core dies through the plurality of channels. At least one of the plurality of core dies may include a bank including a memory cell, and a processing in memory (PIM) block that includes a register storing a plurality of instructions to be executed, and that is associated with the bank, and the PIM block is configured to: acquire one or more instructions of the plurality of instructions stored in the register; determine whether the one or more instructions operate independently of the bank; and based on the one or more instructions operating independently of the bank, perform computational processing corresponding to the one or more instructions during a first time interval in which the bank is in an inactive state.

According to various aspects of the present disclosure, at least a part of the instruction stored in the register of the PIM block is processed while the bank is in the inactive state, thereby improving the computational efficiency and/or performance of the PIM block or the memory device including the PIM block. In addition, it is possible to use the bandwidth of the bank of the memory device including the PIM block to the maximum.

The effects that can be obtained through the present disclosure are not limited to those described above. Technical effects not mentioned herein will be clearly understood by those skilled in the art from the description of the present disclosure described below.

BRIEF DESCRIPTION OF DRAWINGS

Embodiments will be more clearly understood from the following detailed description taken in conjunction with the accompanying drawings in which:

FIG. 2 is a block diagram illustrating an example in which PIM blocks and banks are arranged in a memory device;

DETAILED DESCRIPTION

Figure 1:
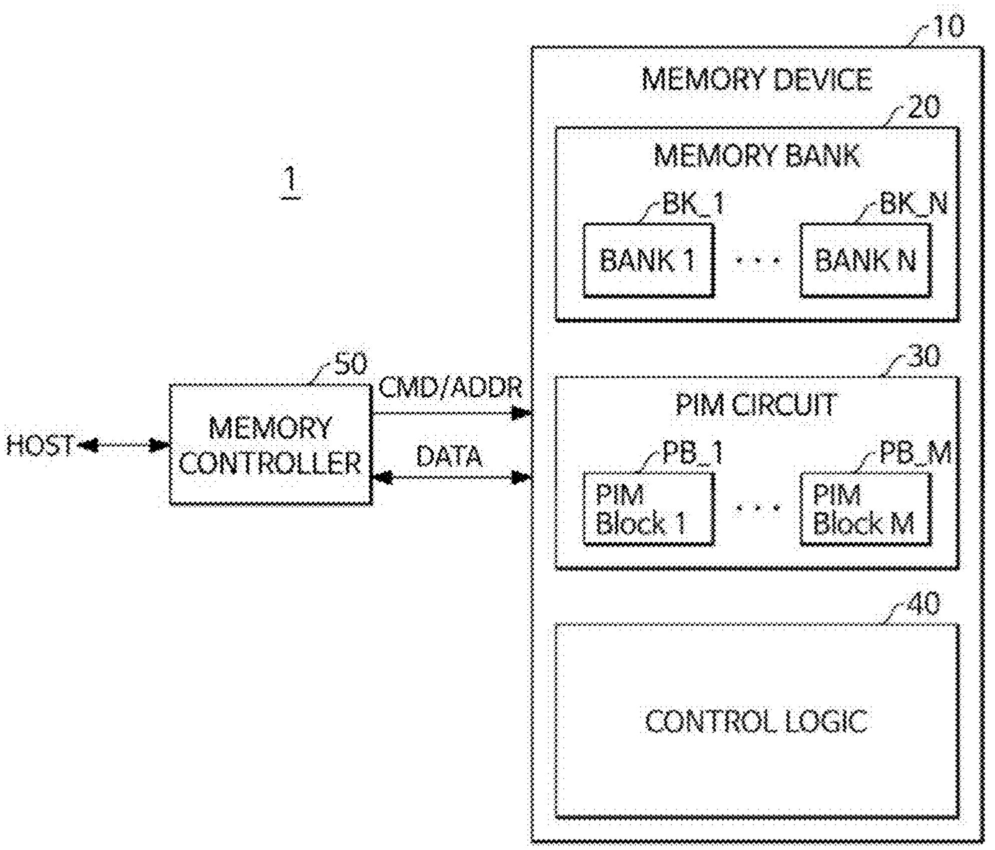
FIG. 1 is a block diagram illustrating a memory system including a memory device.

Hereinafter, various aspects of the present disclosure will be described with reference to FIGS. 1 to 12. The same reference numerals may refer to the same components throughout the description.

FIG. 1 is a block diagram illustrating a memory system 1 including a memory device 10. Referring to FIG. 1, the memory system 1 may include the memory device 10 and a memory controller 50. For example, the memory system 1 may be included in a desktop computer, a laptop computer, a smartphone, a personal digital assistant (PDA), a portable media player, a tablet device, a wearable device, neural implant, etc., but is not limited thereto.

The memory controller 50 may control the memory device 10 according to a request from the external host HOST. The memory controller 50 may communicate with the external host HOST using various protocols.

For example, the memory controller 50 may communicate with the external host HOST using an interface protocol such as Peripheral Component Interconnect-Express (PCI-E), Advanced Technology Attachment (ATA), Serial ATA (SATA), Parallel ATA (PATA), or Serial Attached SCSI (SAS). In addition, various other interface protocols such as Universal Serial Bus (USB), Multi-Media Card (MMC), Enhanced Small Disk Interface (ESDI), or Integrated Drive Electronics (IDE) may be applied to protocols between the external host HOST and the memory controller 50.

Alternatively, the memory controller 50 may be included in the external host HOST. In this case, the external host HOST may control the memory device 10.

The memory controller 50 may include a memory interface, and may transmit a signal for controlling the operation of the memory device 10 to the memory device 10 through the memory interface. The memory controller 50 may provide a control command CMD and an address ADDR to the memory device 10, and the memory device 10 may perform an operation indicated by the command CMD with reference to the address designated by the address ADDR.

The control command CMD may include an activation command, a refresh command, a precharge command, a read command, a write command, a command for instructing computational processing, etc. The activation command may be a command for activating a target row of the cell array to write data to the cell array in a memory bank 20 or to read data from the cell array. The refresh command may be a command for performing a refresh operation in the cell array. The read or write command may be a command for performing a read or write operation in a target memory cell of the activated row.

The memory device 10 may be a dynamic random access memory (DRAM), such as a double data rate synchronous dynamic random access memory (DDR SDRAM), a low power double data rate (LPDDR) SDRAM, a graphics double data rate (GDDR) SDRAM, a rambus dynamic random access memory (RDRAM), etc. However, aspects are not limited to the above, and according to an aspect, the memory device 10 may be a nonvolatile memory such as flash memory, magnetic RAM (MRAM), ferroelectric RAM (FeRAM), phase change RAM (PRAM), and resistive RAM (ReRAM).

The memory device 10 may include the memory bank 20, a PIM circuit 30, and a control logic 40. The memory bank 20 may include a plurality of banks BK_1 to BK_N (where N is a natural number equal to or greater than 2).

The control logic 40 may receive an address ADDR and a control command CMD from the external host HOST. The address ADDR may include information for indicating the location of the data DATA. For example, the address ADDR may include at least one of a row address indicating at least one of rows of a memory cell array included in each of the plurality of banks BK_1 to BK_N, and a column address indicating at least one of columns of the memory cell array included in each of the plurality of banks BK_1 to BK_N. Additionally or alternatively, the address ADDR may include a register address of each of a plurality of PIM blocks PB_1 to PB_M.

The PIM circuit 30 may include a plurality of PIM blocks PB_1 to PB_M (where, M is a natural number equal to or greater than 2). Each of the plurality of PIM blocks PB_1 to PB_M may be arranged to correspond to each of the plurality of banks BK_1 to BK_N. That is, a first PIM block PB_1 may be arranged to correspond to a first bank BK_1, a second PIM block PB_2 may be arranged to correspond to a second bank BK_2, and an Mth PIM block PB_M may be arranged to correspond to the Nth bank BK_N. In this case, M may be the same value as N. However, aspects are not limited thereto, and according to some aspects, a plurality of banks may be arranged to correspond to one PIM block, or a plurality of PIM blocks may be arranged to correspond to one bank. For example, as illustrated in FIG. 2, two of the plurality of banks BK_1 to BK_N may share one of the plurality of PIM blocks PB_1 to PB_M.

In response to receiving a command/address CMD/ADD instructing computational processing from the memory controller 50, each of the plurality of PIM blocks PB_1 to PB_M may perform computational processing corresponding to an instruction read from each of the registers (or command register files). Each of the plurality of PIM blocks PB_1 to PB_M may read data DATA through the information indicated by the address ADD, and perform computational processing corresponding to the read instruction using the read data DATA. For example, each of the plurality of PIM blocks PB_1 to PB_M may perform the computational processing using the data acquired from at least one of the plurality of banks BK_1 to BK_N and/or data in the register of each of the plurality of PIM blocks PB_1 to PB_M.

During a time interval in which the bank is in the inactive state, each of the plurality of PIM blocks PB_1 to PB_M may perform computational processing corresponding to one or more instructions operating independently of the bank in the inactive state, of the plurality of instructions stored in the register of each of the plurality of PIM blocks PB_1 to PB_M. In this case, the bank in the inactive state may be one or more banks corresponding to each of the plurality of PIM blocks PB_1 to PB_M, or may be at least one of the plurality of banks BK_1 to BK_N. This will be described in detail below with reference to FIGS. 8 to 10.

FIG. 2 is a block diagram illustrating an example in which PIM blocks and banks are arranged in a memory device 200. FIG. 2 may illustrate an example in which a plurality of banks BK_1 to BK_N in the memory bank 20 of FIG. 1 and a plurality of PIM blocks PB_1 to PB_M in the PIM circuit 30 are arranged. The memory device 200 may include configurations corresponding to the control logic 40 included in the memory device 10 of FIG. 1, which may be omitted in FIG. 2.

In an example, a plurality of banks may be arranged to correspond to one PIM block in the memory device 200. For example, FIG. 2 illustrates an example in which two banks are arranged to share one PIM block in the memory device 200.

Additionally, the memory device 200 may include a through-silicon via (TSV) region in which a TSV passes through the memory device 200 for electrical connection to other memory devices. This will be described below with reference to FIGS. 11 and 12.

Figure 3:
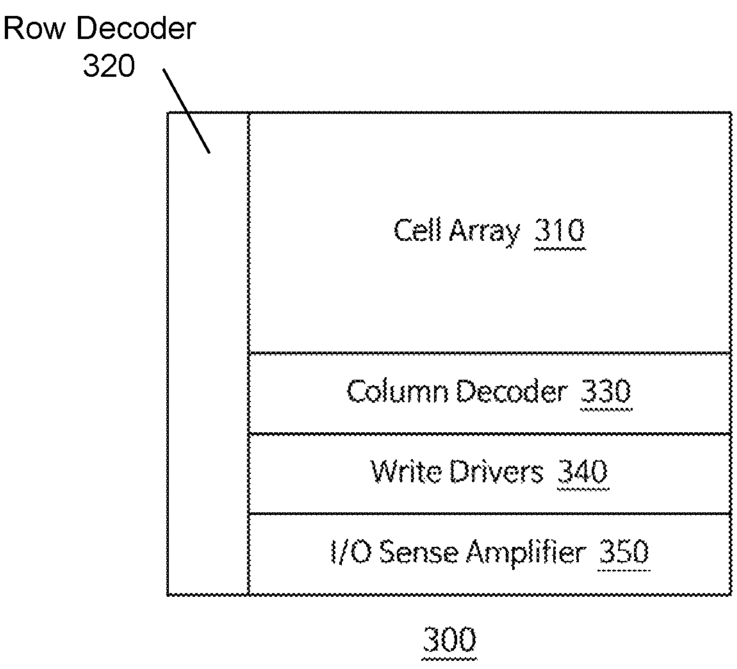
FIG. 3 is a diagram illustrating an internal structure of a bank.

FIG. 3 is a diagram illustrating an internal structure of a bank 300. The bank 300 of FIG. 3 may represent each of the plurality of banks BK_1 to BK_N of FIG. 1. The bank 300 may include a cell array 310, a row decoder 320, a column decoder 330, a write driver 340, and an I/O sense amplifier 350.

The cell array 310 may include a plurality of memory cells implemented using a variable resistance memory, etc.

The row decoder 320 may receive a row address and a row control signal to decode the row address. The column decoder 330 may receive a column address and a column control signal to decode the column address. The memory cell of the cell array 310 may be connected to the row decoder through a plurality of word lines arranged in a row direction, and may be connected to the column decoder through bit lines arranged in a column direction.

The write driver 340 and the I/O sense amplifier 350 may transmit write data to a memory cell selected by the row decoder 320 and the column decoder 330 during a write operation. Likewise, the write driver 340 and the I/O sense amplifier 350 may detect the data stored in a memory cell selected by the row decoder 320 and the column decoder 330 during a read operation.

Additionally, the bank 300 may further include a control logic. The control logic may decode a command received from the outside (e.g., from the memory controller 50 of FIG. 1). For example, the control logic may decode an activation command, a write and read command, a refresh command, a precharge command, etc.

In response to the control logic decoding the refresh command or the precharge command, the cell array 310 may be refreshed or precharged. The bank 300 may be deactivated while the cell array 310 is refreshed or precharged. If the bank 300 is in the inactive state, the performance of the operation of transmitting the write data to the cell array 310 using the write driver 340 and the I/O sense amplifier 350 and/or the operation of detecting the data stored in the cell array 310, etc. may be limited.

Figure 4:
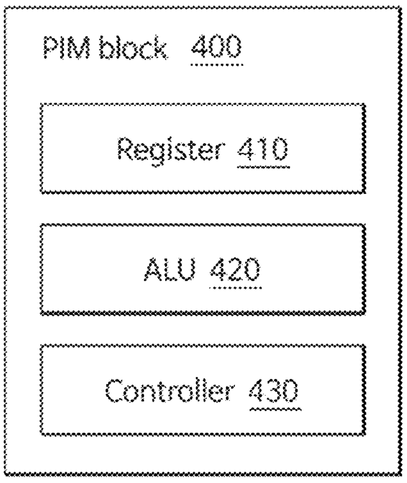
FIG. 4 is a block diagram illustrating an internal structure of a PIM block.

FIG. 4 is a block diagram illustrating an internal structure of a PIM block 400. The PIM block 400 may include a register 410, an arithmetic logic unit 420, and a controller 430. The PIM block 400 illustrated in FIG. 4 briefly illustrates only the main components, and some components may be omitted. A PIM block 400 may represent each of the plurality of PIM blocks PB_1 to PB_M of FIG. 1.

The register 410 may store a plurality of instructions to be executed in the PIM block 400. The register 410 may store an operand as an object of the computational processing and/or results of the computational processing.

The arithmetic logic unit 420 may receive an operation code and an operand of each of the plurality of instructions stored in the register 410 and calculate a result value based on the operation code and the operand.

The arithmetic logic unit 420 may perform various operations using the data of the register 410 and/or the data acquired from the bank (e.g., the bank 300 of FIG. 3). For example, the arithmetic logic unit 420 may perform operation such as data inversion, data shift, data swap, data comparison, logical operations such as AND and XOR, and numerical operations such as multiplication, addition, subtraction, etc.

The controller 430 may control the operations of the register 410 and the arithmetic logic unit 420. For example, the controller 430 may fetch a plurality of instructions stored in the register 410 and transmit each operand of the plurality of instructions to the arithmetic logic unit 420. In this case, the operand may be acquired from a bank outside the register 410 and/or the PIM block 400. In addition, the controller 430 may control so that the intermediate values, result values and others calculated from the arithmetic logic unit 420 are stored in the bank outside the register 410 and/or the PIM block 400.

Figure 5:
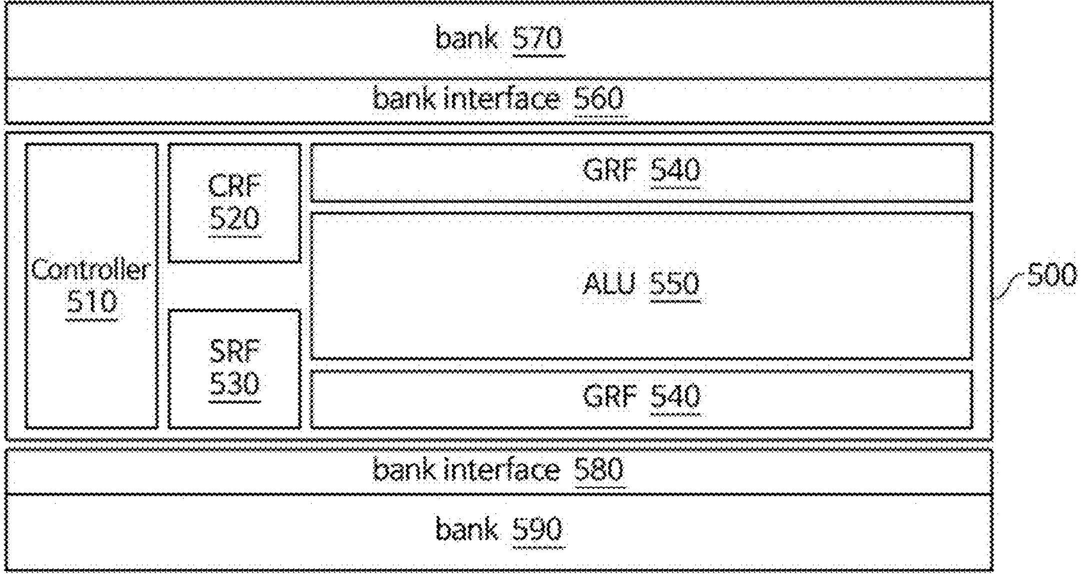
FIG. 5 is a block diagram illustrating an internal structure of a PIM block in detail.

FIG. 5 is a block diagram illustrating an internal structure of a PIM block 500 in detail. The PIM block 500 may be any one of the plurality of PIM blocks PB_1 to PB_M of FIG. 1, and banks 570 and 590 may be banks, of the plurality of banks BK_1 to BK_N of FIG. 1, that are associated with the PIM block 500.

A controller 510 and an arithmetic logic unit 550 of FIG. 5 may correspond to the controller 430 and the arithmetic logic unit 420 of FIG. 4, respectively. A command register file (CRF) 520, a scalar register file (SRF) 530, and a general-purpose register file (GRF) 540 of FIG. 5 may correspond to or be included in the register 410 of FIG. 4.

The command register file 520 may store instructions to be executed in the PIM block 500. The instruction stored in the command register file 520 may include an operation code, an address at which an operand is stored, and/or an address at which a result value is to be stored.

Instructions may be stored in the command register file 520 in various ways. For example, the instructions may be stored by applying a queue-based or circular queue-based storage method of a first input first output (FIFO) structure.

The scalar register file 530 and the general-purpose register file 540 may store operands such as arithmetic operations, logical operations, etc. Additionally, the general-purpose register file 540 may store various types of data necessary for executing a program, such as data, pointers, addresses, etc. associated with data movement, flow control, etc. The general-purpose register file 540 may include two or more general-purpose register files. For example, the general-purpose register file 540 may include a first general-purpose register file and a second general-purpose register file, as illustrated in FIG. 5.

The PIM block 500 may be connected to the banks 570 and 590 through bank interfaces 560 and 580. The bank interfaces 560 and 580 may include the I/O sense amplifier 350 of FIG. 3. In addition, the bank interfaces 560 and 580 may be included in the PIM block 500 or the banks 570 and 590.

If the banks 570 and 590 are in the inactive state, the operation of the PIM block 500 accessing the banks 570 and 590 may be limited or forbidden. For example, the performance of the operation of acquiring operands from the banks 570 and 590 and/or the operation of storing the result values and others calculated by the arithmetic logic unit 420 in the banks 570 and 590 may be limited or forbidden.

On the other hand, the operation of accessing the command register file 520, the scalar register file 530, and the general-purpose register file 540 of the PIM block 500 may not be limited or forbidden even if the banks 570 and 590 are in an inactive state. With this, the computational processing corresponding to at least some of the instructions stored in the command register file 520 may be performed even when the banks 570 and 590 are in the inactive state. This will be described in detail below with reference to FIGS. 8 to 10.

Figure 6:
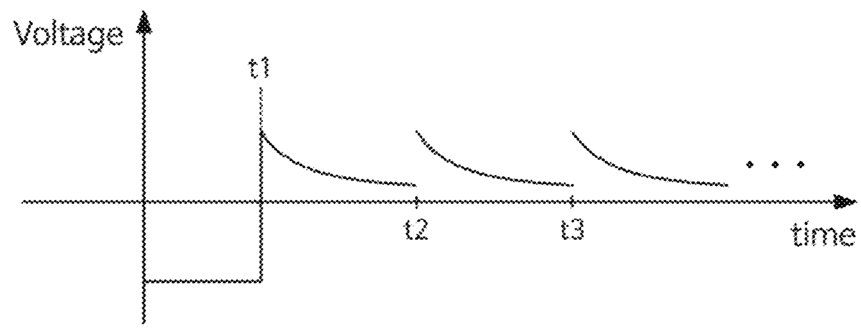
FIG. 6 is a diagram illustrating an example in which the bank is deactivated, in which a refresh operation is performed on the memory cell in the memory device.

FIG. 6 is a diagram illustrating an example in which the bank is deactivated, in which a refresh operation is performed on the memory cell in the memory device. Volatile memory devices such as dynamic random access memory (DRAM) may store data by storing charges in the capacitive load of the memory cell, and read data by determining the charges stored in the capacitive load. Because the charge stored in the capacitive load may leak over time, the memory device may periodically perform a refresh operation on the memory cell or the cell array in the bank. The bank may be deactivated while the refresh operation is performed on the memory cell or the cell array.

For example, in the graph of FIG. 6, it can be seen that, after data is stored in a specific memory cell of the cell array in the bank at a first time t1, the charge stored in the capacitive load of the memory cell leaks over time and thus the voltage value decreases. It can also be seen that, as the voltage value decreases, the refresh operation is performed at each of a second time t2 and a third time t3 in the memory cell and thus the voltage value is periodically recovered.

Figure 7:
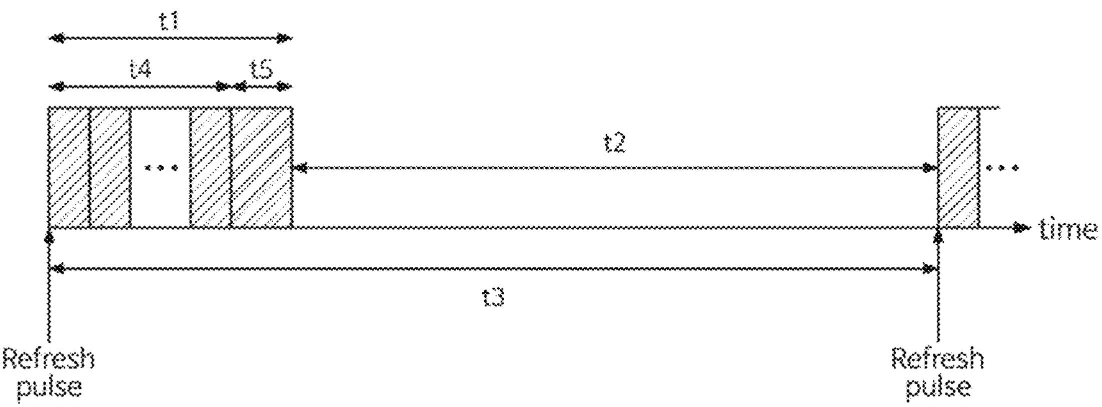
FIG. 7 is a diagram illustrating an example of a plurality of time intervals associated with a bank refresh operation.

FIG. 7 is a diagram illustrating an example of a plurality of time intervals associated with a bank refresh operation. For example, FIG. 7 may represent a plurality of time intervals associated with the refresh operation of each of the plurality of banks BK_1 to BK_N of FIG. 1.

The refresh operation (e.g., the refresh operation of FIG. 6) may be performed in response to a bank receiving a refresh pulse. The refresh pulse may be generated by decoding a refresh command received from a memory controller (e.g., the memory controller 50 of FIG. 1). During a first time interval t1 in which the refresh operation is performed in the cell array of the bank, the bank is in the inactive state and access associated with the data in the bank may be limited. In other words, the bank performs the refresh operation repeatedly for a plurality of periods, and the refresh operation is triggered by a refresh pulse.

A second time interval t2 is a time interval in which the bank is in the active state and not refreshed, and may represent a time interval in which read and/or write for the cell array in the bank is possible. It is to be noted that the bank may be deactivated in some of the second time interval t2 by the precharge operation of the bank.

A third time interval t3 may represent a time interval (refresh interval) after the refresh operation of the bank is initiated and before the next refresh operation is initiated. For example, the third time interval may correspond to the (t1, t2) interval or the (t2, t3) interval of FIG. 6. The length of the third time interval may indicate a period in which the refresh operation is performed.

The first time interval t1 in which the bank is deactivated by the refresh operation may include a fourth time interval t4 and a fifth time interval t5.

The fourth time interval t4 may represent a time interval in which a plurality of rows of the cell array in the bank are activated and precharged. In FIG. 7, each of the plurality of blocks illustrated in the fourth time interval t4 may represent a time interval (row cycle time) during which each of the plurality of rows of the cell array in the bank is activated and precharged.

A fifth time interval t5 may represent a time interval in which the cell array in the bank is recovered.

The graph illustrated in FIG. 7 may be equally applicable to each of a plurality of banks in the memory device. For example, for the plurality of banks BK_1 to BK_N of FIG. 1, the refresh operation may be initiated at the same time point, and the refresh operation may be performed at the same period. Alternatively, the refresh operation may be performed on each of a plurality of banks (e.g., the plurality of banks BK_1 to BK_N in FIG. 1) in the memory device based on different operation start times and/or periods. Alternatively, the refresh operation may be performed on some of a plurality of banks (e.g., the plurality of banks BK_1 to BK_N in FIG. 1) in the memory device at the same period, and the refresh operation may be performed on each of the other banks of the plurality of banks (e.g., the plurality of banks BK_1 to BK_N in FIG. 1) based on different operation start times and/or periods.

Figure 8:
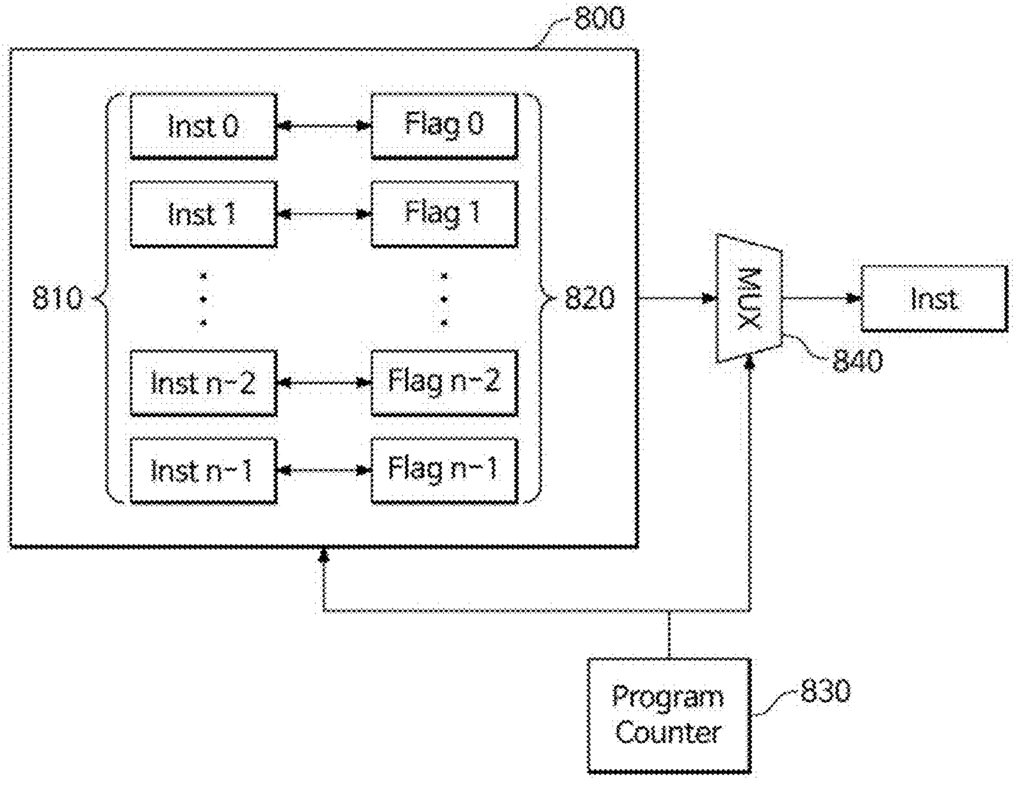
FIG. 8 is a diagram illustrating an example in which an instruction to be executed in the PIM block is determined.

FIG. 8 is a diagram illustrating an example in which an instruction to be executed in the PIM block is determined.

A register 800 may be included in any PIM block (e.g., any one of PB_1 to PB_M of FIG. 1). The register 800 may correspond to the register 410 of FIG. 4 or the command register file 520 of FIG. 5.

The register 800 may store a plurality of instructions 810 (Inst 0 to Inst n−1, where n is any natural number) to be executed by the PIM block. Each of the plurality of instructions 810 may include an operation code, an address at which the operand is stored, and an address at which a result value is to be stored. The plurality of instructions 810 may be received from a memory controller (e.g., the memory controller 50 of FIG. 1).

The register 800 may store a plurality of flag values 820 (Flag 0 to Flag n−1, where n is any natural number) associated with the plurality of instructions 810. Each of the plurality of flag values 820 may indicate whether each of the plurality of instructions 810 operates independently of the bank. For example, the flag value corresponding to the instruction operating independently of the bank may be set to a first flag value (e.g., 0). By contrast, a flag value corresponding to an instruction operating dependently on the bank may be set to a second flag value (e.g., 1) that is different from the first flag value. Each of the plurality of flag values 820 may be set in response to receiving each of the plurality of instructions 810 from the memory controller.

Whether each of the plurality of instructions 810 operates independently of the bank or not may be determined by a PIM block (e.g., the controller 430 of the PIM block 400) in which the plurality of instructions 810 are stored. The PIM block may determine whether or not each of the plurality of instructions 810 operates independently of the bank associated with the PIM block. For example, each of the PIM blocks illustrated in FIG. 2 may determine whether each of the plurality of instructions 810 operate independently of Bank 0 and/or Bank 1.

An instruction operating independently of a bank may refer to an instruction that can be processed without accessing the bank. By contrast, an instruction operating dependently on the bank may refer to an instruction that cannot be processed without accessing the bank.

Whether each of the plurality of instructions 810 operates independently of the bank or not may be determined based on at least one of an operation code of each of the plurality of instructions 810, an address at which an operand of each of the plurality of instructions 810 is stored, or an address at which a result value of each of the plurality of instructions 810 is to be stored.

In an example, in response to the operation code of a specific instruction being an operation code (e.g., call a procedure (CALL), jump unconditionally to label (JMP), return address (RET), and others.) associated with changing the execution flow of a program, the specific instruction may be determined to be the instruction operating independently of the bank. Alternatively, FILL instruction and others may be determined to be the instruction operating dependently on the bank.

In an example, if the operation code of a specific instruction is a logical operation (e.g., AND, OR, XOR, NOT, etc.) or a shift and rotation operation (e.g., SHL, SHR, ROL, ROR, etc.), in response to the address at which the operand of the specific instruction is stored being the address in the register of the PIM block, the specific instruction may be determined to be the instruction operating independently of the bank. By contrast, the specific instruction may be determined to be the instruction operating dependently on the bank, in response to the address at which the operand is stored being an address in the bank associated with the PIM block.

In an example, if the operation code of a specific instruction is an arithmetic operation (e.g., ADD, SUB, MUL, MAC, etc.), in response to the address at which the operand of the specific instruction is stored and the address at which the result value is to be stored being the addresses within the register of the PIM block, the specific instruction may be determined to be the instruction operating independently of the bank. By contrast, the specific instruction may be determined to be the instruction operating dependently on the bank, in response to at least one of the addresses in which the operand is stored or the addresses in which the result value is to be stored being an address in the bank associated with the PIM block.

For example, for an instruction "ADD GRF_A, GRF_B, GRF_B (details of the address are omitted)", which is an instruction in which all operands of the addition operation are stored in the register in the PIM block and in which the result value is stored in the register in the PIM block, this instruction may be determined to be the instruction operating independently of the bank. On the other hand, an instruction "MUL GRF_B, BANK, GRF_A" or "MUL GRF_B, GRF_A, BANK", in which one of the operands of the multiplication operation is stored in the bank or the result value is stored in the bank, may be determined to be instructions operating dependently on the bank.

The PIM block may include a program counter (PC) 830 and a multiplexer 840. The program counter 830 may indicate any one of the plurality of instructions 810, and the multiplexer 840 may output an instruction indicated by the program counter 830. Computational processing corresponding to the instruction output from the multiplexer 840 may be performed by the PIM block.

A counting value of the program counter 830 may be changed based on whether the bank associated with the PIM block is activated, whether the instruction indicated by the current counting value operates dependently on the bank, whether the computational processing corresponding to the instruction indicated by the current counting value is performed, etc. For example, the counting value of the program counter 830 may be changed by the different algorithms, depending on whether the bank associated with the PIM block is activated or not. This will be described in detail below with reference to FIGS. 9 and 10.

In some embodiments, the program counter 830 will count on its own, independent of operation of the status of the bank. For example, the program counter 830 may operate at the clock speed of the processor die or some multiple thereof. Embodiments herein check instructions output by the program counter 830 to check if they can be executed without accessing the bank. If they can be executed without access to the bank, they will be activated regardless of the bank's status. If the instructions use the bank, they will not be executed. In such a situation, the program counter 830 may increment the value and output the next instruction, or operation of the memory device may be halted until the bank becomes active.

In other embodiments, there are multiple banks controlled by the PIM block. When the program counter 830 outputs an instruction configured to use a bank, the PIM block selects an active bank for execution of the instruction, from among a combination of active and inactive banks.

Figure 9:
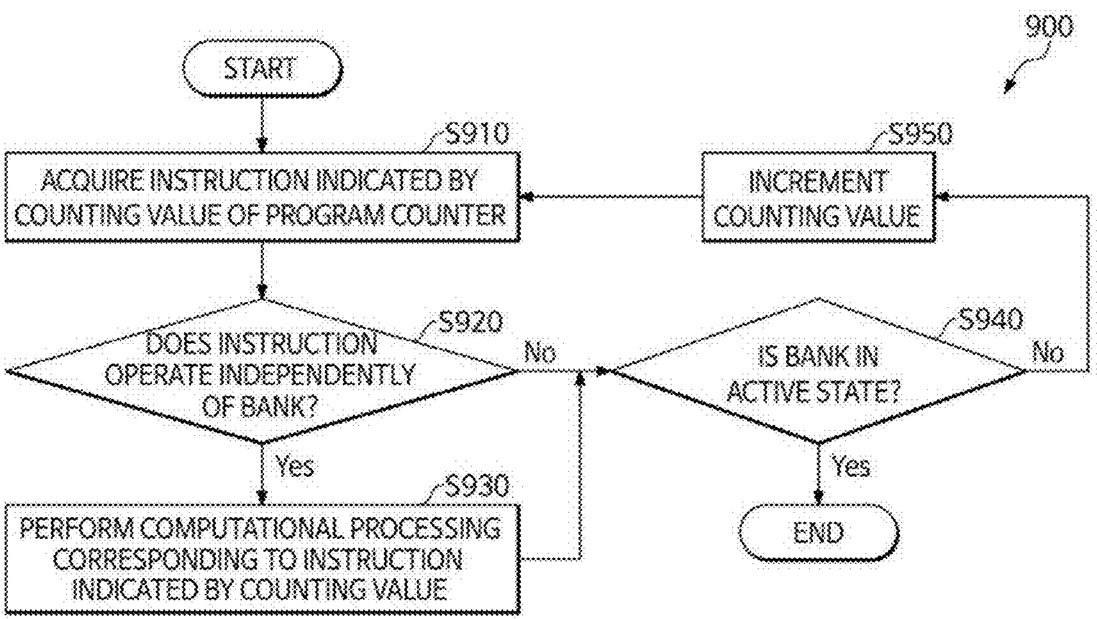
FIG. 9 is a flowchart illustrating an example of a method for operating a PIM block in a time interval in which a bank is in an inactive state.

FIG. 9 is a flowchart illustrating an example of a method 900 for operating a PIM block in a time interval in which a bank is in an inactive state. The method 900 for operating the PIM block may be performed in the PIM block, using the internal components of the PIM block described above. The time interval in which the bank is in the inactive state may include at least one of a time interval in which the bank performs a refresh operation (e.g., t1 in FIG. 7) or a time interval in which the bank performs a precharge operation. The bank may be a bank associated with the PIM block.

The method 900 for operating the PIM block may be initiated in response to the bank being switched to the inactive state.

Accordingly, the method 900 for operating the PIM block is initiated, and an instruction (e.g., any one of the plurality of instructions 810 in FIG. 8) indicated by the counting value of the program counter (e.g., the program counter 830 in FIG. 8) may be acquired, at S910. The instruction may be stored in the register of the PIM block.

It may be determined whether the acquired instruction is an instruction operating independently of the bank, at S920. Whether the instruction is an instruction operating independently of the bank or not may be determined based on a flag value (e.g., predetermined flag value) associated with the instruction (e.g., any one of the plurality of flag values 820 of FIG. 8).

At S930, in response to determining that the instruction indicated by the counting value of the program counter is the instruction operating independently of the bank at S920, computational processing corresponding to the instruction indicated by the counting value may be performed. Accordingly, some of the instructions stored in the register of the PIM block are processed while the bank is in the inactive state, thereby increasing the computational efficiency and performance of the PIM block or the memory device including the PIM block. In addition, it is possible to use the bandwidth of the bank of the memory device including the PIM block to the maximum.

After S930, it may be determined whether the bank is in the active state, at S940. Unlike the illustration, whether the bank is in the active state or not may be determined before S930 or simultaneously with S930. The method 900 may be terminated in response to determining that the bank is in the active state at S940.

On the other hand, at S940, it may be determined whether the bank is in the active state, in response to determining at S920 that the instruction indicated by the counting value of the program counter is the instruction operating dependently on the bank. The method 900 may be terminated in response to determining that the bank is in the active state at S940. If the bank is switched to the active state, there is no limit to processing the instructions operating dependently on the bank, and accordingly, the corresponding instructions may be processed (e.g., processed through a method 1000 of FIG. 10) by terminating the method 900 without increasing the counting value of the program counter.

Figure 10:
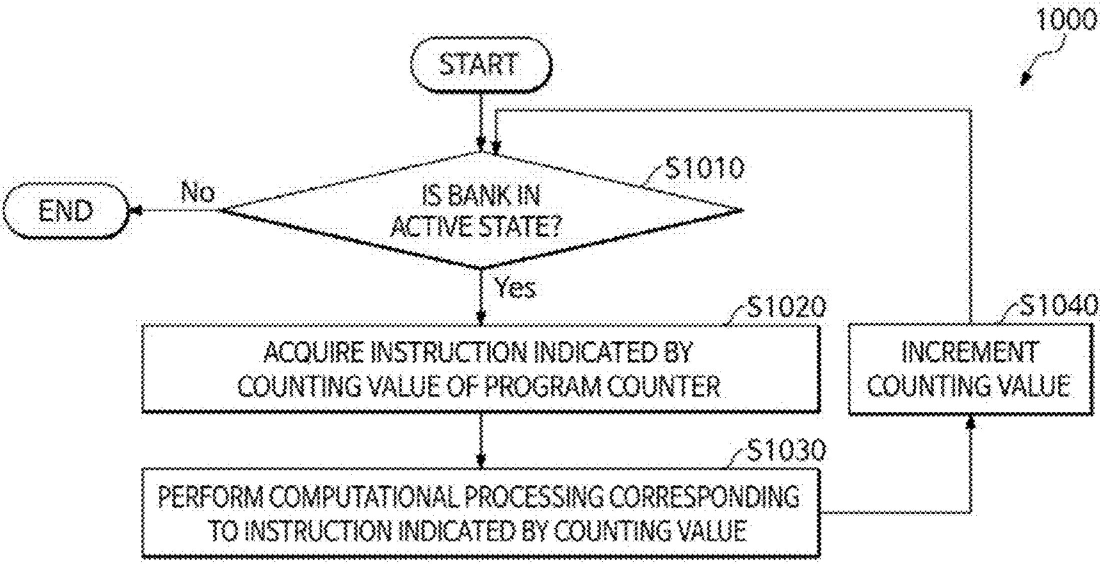
FIG. 10 is a flowchart illustrating an example of a method for operating a PIM block in a time interval in which a bank is in an active state.

The method 1000 of FIG. 10 may be initiated in response to the termination of the method 900 of FIG. 9.

At S950, the counting value of the program counter may be incremented in response to determining that the bank is in the inactive state at S940. The operations of the flowchart may be iterated from S910 based on the increased counting value. For example, in response to determining that the next instruction indicated by the incremented counting value is the instruction operating independently of the bank, computational processing corresponding to the next instruction may be performed.

According to the method 900 of FIG. 9, during the time interval in which the bank is in the inactive state, the PIM block may perform the computational processing corresponding to one or more instructions, of a plurality of instructions stored in the register of the PIM block, that operate independently of the bank (or that are given flag values indicating the same).

FIG. 10 is a flowchart illustrating an example of a method 1000 for operating a PIM block in a time interval in which a bank is in an active state. The method 1000 for operating the PIM block may be performed in the PIM block, using the internal components of the PIM block described above. The time interval in which the bank is in the active state may include a time interval excluding a time interval in which the bank performs a refresh operation (e.g., t1 in FIG. 7) and a time interval in which the bank performs a precharge operation. The bank may be a bank associated with the PIM block.

The method 1000 for operating the PIM block may be initiated in response to the bank being switched to the active state. According to the method 1000 for operating the PIM block, it may be determined whether the bank is in the active state, at S1010.

The method 1000 may be terminated in response to determining that the bank is in the inactive state at S1010. The method 900 of FIG. 9 may be initiated in response to the termination of the method 1000 of FIG. 10.

On the other hand, at S1020, in response to determining that the bank is in the active state at S1010, an instruction (e.g., any one of the plurality of instructions 810 in FIG. 8) indicated by the counting value of the program counter (e.g., the program counter 830 in FIG. 8) may be acquired.

At S1030, computational processing corresponding to the instruction indicated by the counting value of the program counter may be performed. The computational processing corresponding to the instruction indicated by the counting value of the program counter may be performed in response to receiving a write command or a read command from the memory controller.

At S1040, the counting value of the program counter may be incremented. The operations of the flowchart may be iterated from S1010 based on the increased counting value. For example, computational processing corresponding to the next instruction indicated by the incremented counting value may be performed.

The flowcharts illustrated in FIGS. 9 and 10 and the above description are merely examples, and may be implemented differently in some embodiments. For example, one or more operations in the flowchart may be omitted, the order of operations may be changed, one or more operations may be performed in parallel, or one or more operations may be repeatedly performed multiple times.

For example, S940 and S1010 may be omitted from the flowchart, and whether the bank is in the active state or not may be determined at predetermined time intervals. In this case, immediately upon determining that the bank is in the active state, the method 900 of FIG. 9 may be terminated and the method 1000 of FIG. 10 may be executed. Conversely, immediately upon determining that the bank is in the inactive state, the method 1000 of FIG. 10 may be terminated and the method 900 of FIG. 9 may be executed.

Figure 11:
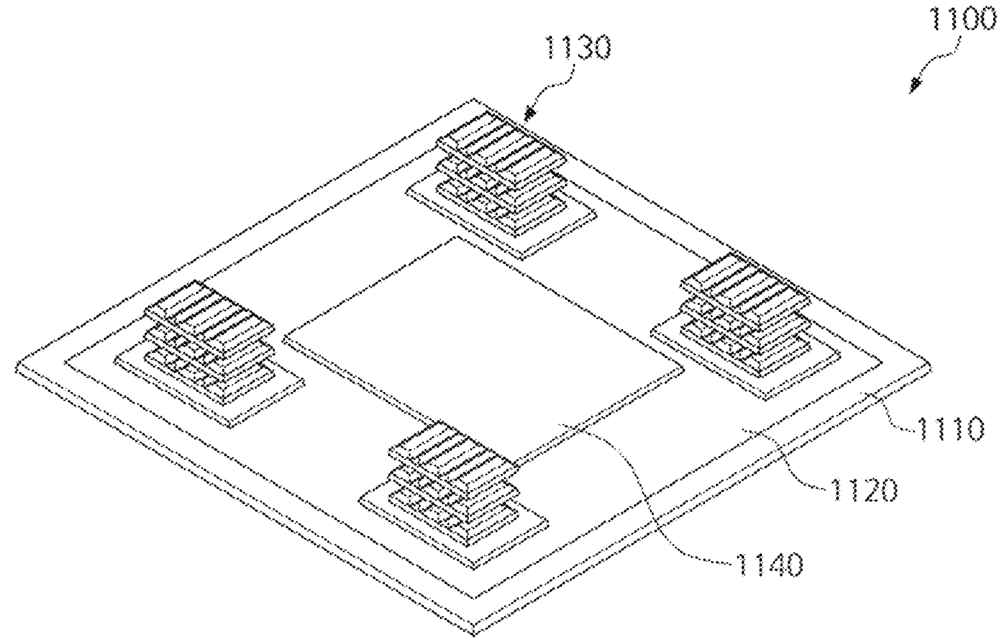
FIG. 11 is a diagram illustrating an example of implementing a semiconductor package.

FIG. 11 is a diagram illustrating an example of implementing a semiconductor package 1100.

Referring to FIG. 11, the semiconductor package 1100 may include a stacked memory device 1130 and a processor die 1140. The stacked memory device 1130 and the processor die 1140 may be stacked on an interposer 1120, and the interposer 1120 may be stacked on a package substrate 1110. The semiconductor package 1100 may transmit and receive signals to and from other external packages or semiconductor devices through a solder ball attached to a lower portion of the package substrate 1110.

Each of the stacked memory devices 1130 may be implemented based on a high-bandwidth memory (HBM) standard. However, aspects are not limited thereto, and each of the stacked memory devices 1130 may be implemented based on a graphics double data rate (GDDR), a hybrid memory cube (HMC), or a wide I/O standard.

The stacked memory device 1130 may include a plurality of core dies and a buffer die. At least one of a plurality of core dies may include the memory device (e.g., the memory device 10 of FIG. 1) illustrated and described with reference to the previous drawings.

The processor die 1140 may include at least one processor such as a CPU, an AP, a GPU, an NPU, an SoC, etc.

The processor die 1140 may include a memory controller (e.g., the memory controller 50 of FIG. 1) that controls the stacked memory device 1130. The processor die 1140 may transmit and receive signals to and from a corresponding stacked memory device through the memory controller. Alternatively, the memory controller may be included in the stacked memory device 1130.

The memory controller may control the overall operation of the stacked memory device 1130. The memory controller may transmit signals for controlling the stacked memory device 1130 to the stacked memory device 1130 through a physical layer.

Figure 12:
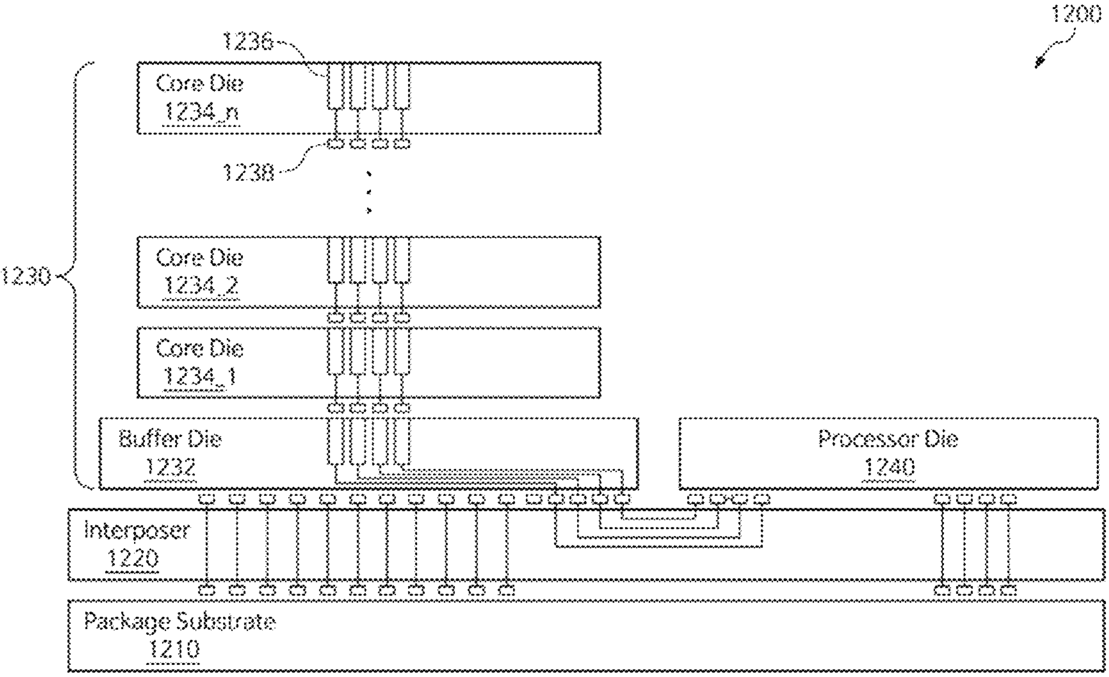
FIG. 12 is a cross-sectional view of a semiconductor package.

FIG. 12 is a cross-sectional view of a semiconductor package 1200. A package substrate 1210, an interposer 1220, a stacked memory device 1230, and a processor die 1240 of FIG. 12 may correspond to the package substrate 1110, the interposer 1120, the stacked memory device 1130, and the processor die 1140 of FIG. 11, respectively.

The stacked memory device 1230 may include a buffer die 1232 and core dies 1234_1 to **1234_*n*** (where, n is any natural number).

At least one of the core dies 1234_1 to **1234_*n* may include the memory device (e.g., the memory device 10 of FIG. 1) illustrated and described with reference to the previous drawings. For example, at least one of a plurality of core dies may include a bank including a memory cell and a PIM block associated with the bank, and the PIM block may perform computational processing corresponding to one or more instructions operating independently of the bank during a time interval in which the bank is in the inactive state. Accordingly, it is possible to increase the computational efficiency and performance of the stacked memory device 1230 and the semiconductor package 1200**.

The buffer die 1232 may be electrically connected to the processor die 1240 through the interposer 1220. The stacked memory device 1230 may receive signals from the processor die 1240 through the buffer die 1232, or transmit signals to the processor die 1240.

For example, the core dies 1234_1 to **1234_*n* may receive an address ADDR and a control command CMD from the processor die 1240 through the buffer die 1232, and in response, transmit the processed memory operation result to the processor die 1240. For example, the core dies 1234_1 to 1234_*n* may transmit read data to the processor die 1240 in response to a read command, or transmit a response indicating that data write operation is completed to the processor die 1240** in response to a write command.

The stacked buffer die 1232 and core dies 1234_1 to **1234_*n* may be electrically connected to each other (interconnected) through a through silicon via (TSV) 1236 and a bump 1238. For example, the core dies 1234_1 to 1234_*n* may be connected to each other through a plurality of channels provided by a plurality of TSVs 1236, and the buffer die 1232 may control the core dies 1234_1 to 1234_*n* through the plurality of channels. The buffer die 1232 may receive signals provided to each channel from the processor die 1240 through the bump 1238** allocated for each channel.

The processor die 1240 may execute applications supported by the semiconductor package 1200 using the stacked memory device 1230. For example, the processor die 1240 may include at least one processor of a central processing unit (CPU), an application processor (AP), a graphic processing unit (GPU), a neural processing unit (NPU), a tensor processing unit (TPU), a vision processing unit (VPU), an image signal processor (ISP), a digital signal processor (DSP), and a system on chip (SOC) to execute specialized operations.

The processor die 1240 may include input and output circuits for transmitting and receiving signals to and from the stacked memory device 1230. The processor die 1240 may transmit various signals to the core dies 1234_1 to **1234_*n* through the physical layer, interface circuits, and the TSV 1236**.

The interposer 1220 may connect the stacked memory device 1230 and the processor die 1240. The interposer 1220 may connect the physical layer of the stacked memory device 1230 with the physical layer of the processor die 1240, and may provide physical paths formed with conductive materials. Accordingly, the stacked memory device 1230 and the processor die 1240 may be stacked on the interposer 1220 to transmit and receive signals to and from each other.

The bump may be attached to an upper portion of the package substrate 1210, and a solder ball may be attached to a lower portion thereof. The package substrate 1210 may be a printed circuit board (PCB).

Embodiments herein improve the performance of computer memory. The embodiments constitute specific types of data structures designed to improve the way a computer stores and retrieves data in memory. In particular, embodiments are directed to specific implementations of solutions to problems in the software arts, and thus are not directed to abstract ideas.

While the disclosure has been particularly shown and described with reference to embodiments thereof, it will be understood that various changes in form and details may be made therein without departing from the spirit and scope of the following claims.

What is claimed is:

1. A method for operating a memory device, the method being performed by a processing in memory (PIM) block of a memory device and comprising:

receiving, from a memory controller, a plurality of instructions to be executed in a PIM block;

storing the plurality of instructions in a register of the PIM block;

determining whether each of the plurality of instructions stored in the register operates independently of a bank associated with the PIM block; and performing, during a first time interval in which the bank is in an inactive state, computational processing corresponding to one or more instructions, of the plurality of instructions stored in the register, that operate independently of the bank, the plurality of instructions being indicated by a counting value of a r ter of the PIM block.

2. The method according to claim 1, wherein the bank is configured to perform a refresh operation or a precharge operation during the first time interval.

3. An in-memory processing memory device, the memory device comprising:

a plurality of core dies that are stacked and interconnected via a plurality of channels provided by a plurality of through silicon vias (TSV); and a buffer die configured to control the plurality of core dies through the plurality of channels, wherein at least one of the plurality of core dies comprises a bank comprising a memory cell, and a processing in memory (PIM) block that comprises a register storing a plurality of instructions to be executed, and that is associated with the bank, and wherein the PIM block is configured to:

acquire one or more instructions of the plurality of instructions stored in the register, the one or more instructions being indicated by a counting value of a program counter of the PIM block;

determine whether the one or more instructions operate independently of the bank; and based on the one or more instructions operating independently of the bank, perform computational processing corresponding to the one or more instructions during a first time interval in which the bank is in an inactive state.

4. The memory device according to claim 3, wherein the at least one of the plurality of core dies receives at least one of a control command, an address or data from a host via the buffer die.

5. The memory device according to claim 3, further comprising a memory controller, wherein the bank is configured to perform a refresh operation or a precharge operation during the first time interval, and wherein the memory controller is configured to transmit, to the at least one of the plurality of core dies, a command for instructing the refresh operation or the precharge operation of the bank, and the plurality of instructions to be executed.

6. The memory device according to claim 3, wherein the PIM block is configured to modify the counting value based on the computational processing being performed and the bank being in the inactive state.

7. An in-memory processing memory device, the memory device comprising:

a bank comprising a cell array; and a processing in memory (PIM) block, associated with the bank, comprising a register that stores a plurality of instructions to be executed, wherein the PIM block is configured to:

acquire one or more instructions of the plurality of instructions stored in the register, the one or more instructions being indicated by a counting value of a program counter of the PIM block;

determine whether the one or more instructions operate independently of the bank; and based on the one or more instructions operating independently of the bank, perform computational processing corresponding to the one or more instructions during a first time interval in which the bank is in an inactive state.

8. The memory device according to claim 7, wherein the PIM block is further configured to determine whether or not each of the plurality of instructions stored in the register operates independently of the bank.

9. The memory device according to claim 8, wherein the PIM block is further configured to determine whether each of the plurality of instructions stored in the register operates independently of the bank or not, based on at least one of an operation code of each of the plurality of instructions, an address at which an operand of each of the plurality of instructions is stored, or an address at which a result value of each of the plurality of instructions is to be stored.

10. The memory device according to claim 8, wherein each of the one or more instructions operating independently of the bank, determined in the PIM block, is stored in the register in association with a first flag value, wherein each of one or more instructions operating dependently on the bank, determined in the PIM block, is stored in the register in association with a second flag value, wherein the first flag value and the second flag value are different from each other, and wherein the PIM block is further configured to perform, during the first time interval, computational processing corresponding to at least part of the one or more instructions that are associated with the first flag value.

11. The memory device according to claim 7, wherein the PIM block is further configured to change the counting value of the program counter based on the computational processing being performed and the bank being in the inactive state.

12. The memory device according to claim 7, wherein the PIM block is further configured to, based on the one or more instructions operating dependently of the bank, change the counting value of the program counter to indicate a next instruction during the first time interval.

13. The memory device according to claim 12, wherein the PIM block is further configured to:

determine whether the next instruction operates independently of the bank; and based on the next instruction operating independently of the bank, perform computational processing corresponding to the next instruction during the first time interval.

14. The memory device according to claim 7, wherein the PIM block is further configured to perform, during a second time interval in which the bank is active, computational processing corresponding to the one or more instruction indicated by the counting value of the program counter.

15. The memory device according to claim 14, wherein the PIM block is configured to:

receive a write command or a read command from a memory controller during the second time interval; and based on receiving the write command or the read command, perform computational processing corresponding to the one or more instructions indicated by the counting value of the program counter, and change the counting value of the program counter such that the counting value of the program counter indicates one or more next instructions.

16. The memory device according to claim 15, wherein the PIM block is further configured to perform computational processing corresponding to the next instruction during the second time interval.

17. The memory device according to claim 7, wherein the bank is configured to perform a refresh operation or a precharge operation during the first time interval.

18. The memory device according to claim 17, wherein the bank is configured to perform the refresh operation repeatedly for a plurality of periods, and wherein the refresh operation is triggered by a refresh pulse.

19. The memory device according to claim 17, wherein the bank is configured to perform the refresh operation in a first sub-period in which a plurality of rows of the cell array are activated and precharged, and a second sub-period in which the cell array is recovered.

* * * * *